(12) United States Patent
Iyechika et al.

(10) Patent No.: US 6,225,195 B1
(45) Date of Patent: May 1, 2001

(54) METHOD FOR MANUFACTURING GROUP III-V COMPOUND SEMICONDUCTOR

(75) Inventors: Yasushi Iyechika, Tsukuba; Yoshinobu Ono, Ibaraki; Tomoyuki Takada; Masaya Shimizu, both of Tsukuba, all of (JP)

(73) Assignee: Sumitomo Chemical Company Limited, Osaka (JP)

( * ) Notice: Subject to any disclaimer, the term of this patent is extended or adjusted under 35 U.S.C. 154(b) by 0 days.

(21) Appl. No.: 09/127,922

(22) Filed: Aug. 3, 1998

(30) Foreign Application Priority Data

Aug. 4, 1997 (JP) .................................................. 9-208865

(51) Int. Cl.⁷ .................................................. C30B 23/00
(52) U.S. Cl. .......................... 438/478; 438/604; 117/104
(58) Field of Search .................................... 438/478, 925, 438/501, 604, 505, 508, 509; 117/200, 925, 937, 126, 107, 104, 133, 84

(56) References Cited

U.S. PATENT DOCUMENTS

| 5,381,756 | * | 1/1995 | Kondo et al. | 117/104 |
| 5,458,085 | * | 10/1995 | Kondo et al. | 117/104 |

FOREIGN PATENT DOCUMENTS

| 0716457 A2 | 6/1996 | (EP) . |
| 621511 | 1/1994 | (JP) . |
| 818159 | 1/1996 | (JP) . |
| 936429 | 2/1997 | (JP) . |

OTHER PUBLICATIONS

Y. Ohba et al., Journal of Crystal Growth 145 (1994) p. 214–218.
Shuji Nakamura et al., Jpn. J. Appl. Phys. vol. 34 (1995) pp. L797–L799, Part 2, No. 7A, Jul. 1, 1995.
Shuji Nakamura et al., Jpn. J. Appl. Phys. vol. 34 (1995) pp. L1332–L1335, Part 2, No. 10B, Oct. 15, 1995.
Hisayoshi Hanai et al., Technical Report of IEICE, ED96–29, CPM96–14 (1996–05).
C.J. Sun et al., J. Appl. Phys. 76 (1), Jul. 1, 1994.
Takashi Matsuoka et al., Optoelectronics—Devices and Technologies, vol. 5, No. 1, pp. 53–61, Jun., 1990.

* cited by examiner

*Primary Examiner*—David Nelms
*Assistant Examiner*—Phuc T. Dang
(74) *Attorney, Agent, or Firm*—Birch, Stewart, Kolasch & Birch, LLP

(57) ABSTRACT

A method for manufacturing a group III-V compound semiconductor represented by the general formula $In_xGa_yAl_zN$ (where $x+y+z=1$, $0 \leq x \leq 1$, $0 \leq y \leq 1$, and $0 \leq z \leq 1$) by metalorganic vapor phase epitaxy method is provided. The group III-V compound semiconductor has a semiconductor layer consisting of a p-type dopant-nondoped layer, and a semiconductor layer including a p-type dopant-doped layer. In the method, a reactor for growing the semiconductor layer consisting of a p-type dopant-nondoped layer and a reactor for doping a p-type dopant are mutually different.

10 Claims, 3 Drawing Sheets

METHOD FOR MANUFACTURING GROUP III-V COMPOUND SEMICONDUCTOR

BACKGROUND OF THE INVENTION

1. Field of the Invention

The present invention relates to a method for manufacturing a group III-V compound semiconductor useful for a light-emitting device, and the like, represented by the general formula $In_xGa_yAl_zN$ (where $x+y+z=1$, $0 \leq x \leq 1$, $0 \leq y \leq 1$, and $0 \leq z \leq 1$).

2. Description of the Related Art

There has been known a group III-V compound semiconductor represented by the general formula $In_xGa_yAl_zN$ (where $x+y+z=1$, $0 \leq x \leq 1$, $0 \leq y \leq 1$, and $0 \leq z \leq 1$) as a material for a light-emitting device such as an ultraviolet, blue, or green light-emitting diode, or an ultraviolet, blue, or green laser diode. Hereinafter, in some cases, the x, y, and z in the general formula may be referred to as InN mixed crystal ratio, GaN mixed crystal ratio, and AlN mixed crystal ratio, respectively. In the group III-V compound semiconductors, especially with the one containing 10% or more of InN mixed crystal ratio, the emission wavelength in a visible region can be regulated in accordance with the InN mixed crystal ratio, and hence it is especially important for the display applications.

Examples of the manufacturing method of the group III-V compound semiconductor include molecular-beam epitaxy (hereinafter, may be referred to as MBE) method, metalorganic vapor phase epitaxy (hereinafter, may be referred to as MOVPE) method, and hydride vapor phase epitaxy (hereinafter, may be referred to as HVPE) method. Among these methods, MOVPE method enables the uniform crystal growth over a large area, and hence it is important.

There are known Be, Ca, Mg, Zn, C, and the like as acceptor type dopants for imparting the p-type conductivity to the compound semiconductor. Of these, Mg is capable of implementing higher p-type conductivity than other dopants, and hence it is widely used at present. The following description will be given by taking Mg as an example, however, it is well known that there occur the same troubles with the other p-type dopants.

As Mg sources for use in MOVPE method, there are known bis-cyclopentadienylmagnesium ($(C_5H_5)_2Mg$, hereinafter, may be referred to as $Cp_2Mg$), bis-methylcyclopentadienylmagnesium ($(C_5H_4CH_3)_2Mg$, hereinafter, may be referred to as $MCp_2Mg$), bis-ethylcyclopentadienylmagnesium ($(C_5H_4C_2H_5)_2Mg$, hereinafter, may be referred to as $ECp_2Mg$), and the like. Any of these will be strongly adsorbed on gas piping, a reactor, and the like, and hence the incorporation of the dopants into crystal starts with a delay after the supply of a dopant source. Also, there occurs a trouble that the incorporation of dopants is gradually caused unintentionally in the following runs after the growth in which a dopant source has been flown. These are generally referred to as the memory effect of a dopant.

The large deficiency of the memory effect is especially in that the layer required to be highly pure for use in the emitting layer of a light-emitting device is doped unintentionally with a dopant, and it makes difficult to obtain a layer having a desired quality. These dopant sources react with the materials constituting gas piping or a reactor, after which impurities are gradually released from the materials, also causing a trouble that a layer having a desired high quality cannot be grown. Further, in large equipment of industrial importance, a large amount of dopant source must be supplied, and hence these troubles have been particularly serious problems.

SUMMARY OF THE INVENTION

An object of the present invention is to provide a method for manufacturing a high-quality group III-V compound semiconductor successively with reducing the memory effect of a dopant As a result of conducting various investigations in an attempt to solve the above problems, the inventors have found that by employing two growth reactors, e.g., one reactor in which a raw material having the memory effect is not used, and another reactor in which a raw material having a memory effect is used, and growing layered structures required for a light-emitting device successively, thereby reducing the memory effect of a dopant more than in the case where the growth is performed in one growth reactor. This enables the stable manufacturing of a high-quality nitride system group III-V compound semiconductor repeatedly.

The present invention relates to [1] a method for manufacturing a group III-V compound semiconductor represented by the general formula $In_xGa_yAl_zN$ (where $x+y+z=1$, $0 \leq x \leq 1$, $0 \leq y \leq 1$, and $0 \leq z \leq 1$) by metalorganic vapor phase epitaxy method, the group III-V compound semiconductor having a semiconductor layer consisting of a p-type dopant-nondoped layer, and a semiconductor layer including a p-type dopant-doped layer, wherein a reactor for growing the semiconductor layer consisting of a p-type dopant-nondoped layer and a reactor for doping a p-type dopant are mutually different.

The present invention also relates to [2] a method for manufacturing a group III-V compound semiconductor represented by the general formula $In_xGa_yAl_zN$ (where $x+y+z=1$, $0 \leq x \leq 1$, $0 \leq y \leq 1$, and $0 \leq z \leq 1$) by metalorganic vapor phase epitaxy method, the group III-V compound semiconductor having a semiconductor layer consisting of a p-type dopant-nondoped layer, and a semiconductor layer including a p-type dopant-doped layer, wherein the method comprises the steps of: (1) growing a semiconductor including one or more layers consisting of a p-type dopant-nondoped layer in one reactor, and taking it out of the reactor, and (2) putting the semiconductor obtained in the reactor again to grow a semiconductor layer including a p-type dopant-doped layer on the semiconductor layer consisting of a p-type dopant-nondoped layer in this order, and at least one of the steps (1) or (2) is repeated plural times.

According to the present invention, the influence by contamination in the growth reactor can be suppressed and the repeating reproducibility can be largely improved, by sharing the growth of the layered structure of a light-emitting device with the first and second growth reactors, or by carrying out the growth steps of the layered structure of the light-emitting device separately even if one growth reactor is used. The yield of manufacturing an epitaxial wafer for a high luminance light-emitting device can be greatly increased, and the present invention is extremely useful, and has a great industrial importance.

BRIEF DISCRIPTION OF THE DRAWINGS

Figure 1:
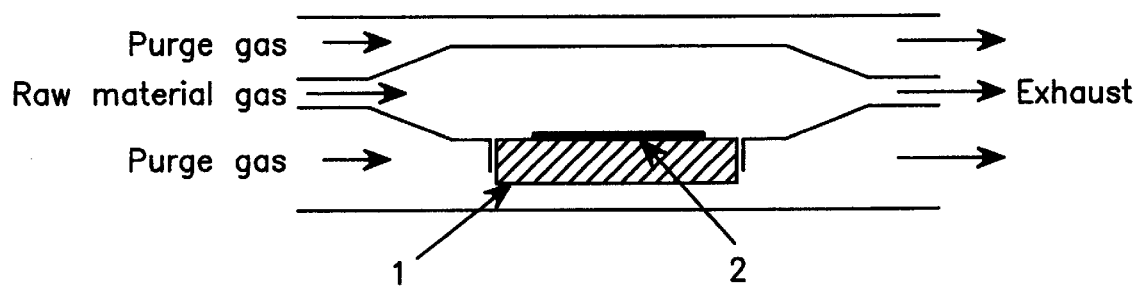
FIG. 1 is a cross-sectional view illustrating one example of the construction of a reactor usable in the present invention.

1 susceptor
2 substrate
3 sapphire substrate
4 buffer layer
5 n-type GaN:Si layer
6 nondoped GaN layer
7 nondoped GaN layer
8 InGaN light emitting layer
9 AlGaN layer
10 laminate of layers grown in a first growth reactor (the first portion)
11 AlGaN layer
12 p-type GaN:Mg layer
13 laminate of layers grown in a second growth reactor (the second portion)
14 InGaN layer
15 InGaN well layer
16 GaN barrier layer

DETAILED DESCRIPTION OF THE INVENTION

Hereinafter, the present invention will be described in detail.

A group III-V compound semiconductor in the present invention is a group III-V compound semiconductor represented by the general formula $In_xGa_yAl_zN$ (where $x+y+z=1$, $0 \leq x \leq 1$, $0 \leq y \leq 1$, and $0 \leq z \leq 1$).

Figure 2:
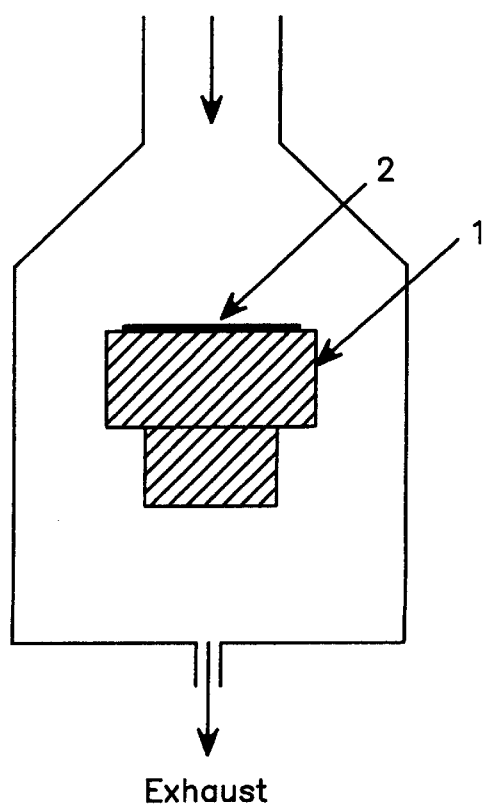
FIG. 2 is a cross-sectional view illustrating another example of the construction of the reactor usable in the present invention.
Figure 3:
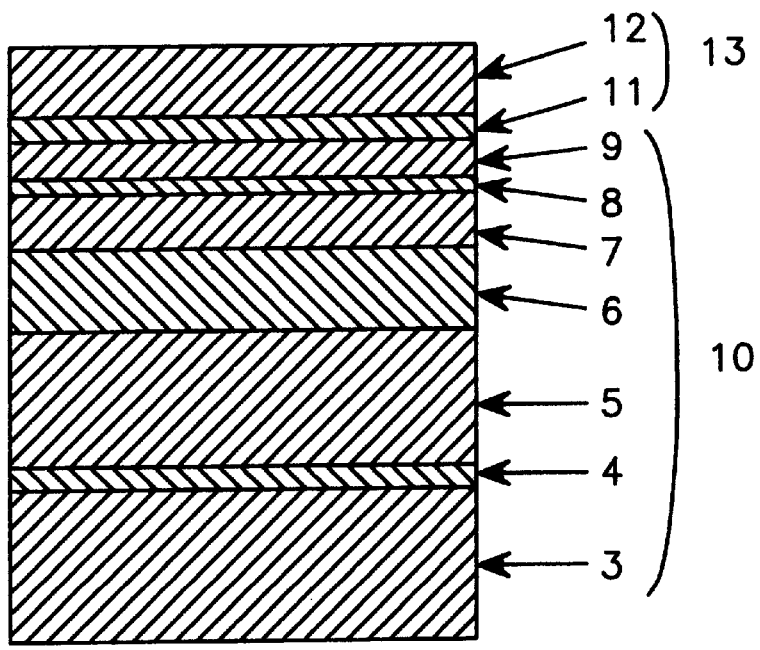
FIG. 3 is a cross-sectional view illustrating the construction of semiconductor layers manufactured in examples 1 to 5.

As a crystal growth apparatus by MOVPE method for use in the method for manufacturing a group III-V compound semiconductor of the present invention, an apparatus having a known structure can be employed. Concrete examples thereof include the apparatus in which a raw material gas is sprayed from the top of a substrate; and the apparatus in which a raw material is sprayed from the side of the substrate. In these, the substrate is placed roughly in the up direction. Contrarily, the apparatus in which the substrate is placed in the down direction can be also used. In this case, example thereof includes the one in which a raw material is supplied from the lower part of the substrate, or is sprayed from the side of the substrate. In these reactors, the substrate is not required to be horizontally oriented correctly, and the case is also included where the substrate is oriented almost vertically, or completely vertically. Typical examples thereof are shown in FIGS. 1 and 2. The same will also apply to a growth apparatus capable of processing a plurality of substrates at the same time, applying such placements of the substrates and gas supply.

The manufacturing method [1] of a group III-V compound semiconductor of the present invention is characterized in that in the manufacturing method of the group III-V compound semiconductor represented by the general formula $In_xGa_yAl_zN$ (where $x+y+z=1$, $0 \leq x \leq 1$, $0 \leq y \leq 1$, and $0 \leq z \leq 1$) by metalorganic vapor phase epitaxy method, the group III–V compound semiconductor having a semiconductor layer [the first portion] consisting of a p-type dopant-nondoped layer, and a semiconductor layer [the second portion] including a p-type dopant-doped layer, wherein a reactor for growing the semiconductor layer consisting of a p-type dopant-nondoped layer and a reactor for doping a p-type dopant are mutually independent and different.

That is, if the step in which the first portion is grown, and consecutively the second portion is grown in the same reactor is repeated, the aforementioned troubles arise at the time of the second and later growth of the first layer due to the memory effect of a dopant. For preventing such a deficiency, the present invention is characterized in that a reactor for doping a p-type dopant and a reactor for growing the semiconductor layer consisting of a p-type dopant-nondoped layer are mutually different.

Consequently, a number of compound semiconductors having grown the first portion can be manufactured successively, and then, each second portion thereof can be grown in another reactor. This can eliminate the memory effect of a dopant in the second and later growth after doping a p-type dopant at the first time.

In this method, the substrates can be taken into the air out of one growth reactor once, and then be reset in another growth reactor. In this case, the taken out substrates can be examined, and the next growth is not necessarily conducted for the ones which do not satisfy the standardized performance, thereby the final generation of defectives can be suppressed.

After taking the substrates out of one growth reactor, the substrates may be further washed with water, organic solvent, or the like, or subjected to such an etching process as to remove the oxide layer on the surface thereof. Concrete examples of a processing material for etching include alkaline solutions such as KOH, NaOH, and aqueous ammonia, mixed solutions of an alkaline solution and hydrogen peroxide solution, or acids such as hydrofluoric acid, hydrochloric acid, and nitric acid, and mixed solutions thereof.

Alternatively, without taking out the substrate into the air, the substrate can be taken out of the first growth reactor under an inert atmosphere such as nitrogen and argon, in an atmosphere of hydrogen, or in a vacuum, to be set in another growth reactor. Further, the substrate may be moved between the growth reactors together with an instrument called susceptor on which the substrate is mounted.

The manufacturing method [2] of a group III-V compound semiconductor of the present invention is characterized in that in the manufacturing method of the group III-V compound semiconductor represented by the general formula $In_xGa_yAl_zN$ (where $x+y+z=1$, $0 \leq x \leq 1$, $0 \leq y \leq 1$, and $0 \leq z \leq 1$) by metalorganic vapor phase epitaxy method, the group III–V compound semiconductor having a semiconductor layer (the first portion) consisting of a p-type dopant-nondoped layer, and a semiconductor layer (the second portion) including a p-type dopant-doped layer, wherein the method comprises the steps of: (1) growing a semiconductor including one or more layers consisting of a p-type dopant-nondoped layer in one reactor, and taking it out of the reactor, and (2) putting the obtained semiconductor in the reactor again to grow a semiconductor layer including a p-type dopant-doped layer on the semiconductor layer consisting of a p-type dopant-nondoped layer in the reactor, on this order, wherein at least one of the steps (1) or (2) is repeated plural times.

Thus, after sequentially repeating the manufacture of semiconductor substrates having only the first portions grown in one growth reactor, the growth of the second portions can be repeated for these substrates in the same growth reactor sequentially, which prevents the memory effect of dopants from arising on the first portion.

It is noted that in the step (1), one or a plurality of semiconductors including one or more layers consisting of a p-type dopant-nondoped layer can be grown, while in the step (2), these are put sequentially or all together into a reactor, so that each second portion can be grown.

In case that the growth of each first portion is to be performed again after a series of runs of growing each second portion are completed, it is preferable to clean the inside of the reactor so that the effect of the p-type dopant may not arise. That is, in the above described manufacturing method of the present invention, it is preferable that the method further includes the step (3) of cleaning the inside of the reactor subsequent to the step (2), and that the steps (1) to (3) are repeated.

In any of the cases [1] and [2], when the substrate is once taken out into the air, it is difficult to avoid oxidation or contamination of other dopants. Also even when the substrate is moved without being taken out into the air between the reactors, contamination of the surface may occur due to dopants. Accordingly, when the second portion is grown, the device characteristics may be sometimes deteriorated. In such a case, a step of holding the substrate at a high temperature after setting it in a reactor can be included to improve the final device characteristics. In this step, it is preferable that ammonia is included in an atmosphere for controlling the thermal degradation of the semiconductor.

The holding temperature is preferably in the range of 500° C. to 1300° C.; more preferably in the range of 600° C. to 1200° C.; and most preferably in the range of 650° C. to 1150° C. When the holding temperature is less than 500° C., the effect of this step cannot be recognized. When the temperature exceeds 1300° C., the first portion may sometimes undergo thermal degradation to entail surface roughness thereof, thus leading to undesirable results.

The holding time effective in the holding process can be appropriately selected according to the temperature to be held. Generally, when the holding temperature is high, the holding time may be short. The suitable holding time has a tendency to increase with a decrease in temperature of the holding step. When temperature is held at 1100° C., a holding time is preferably in the range of 30 seconds to 10 minutes. When held at 900° C., a holding time is preferably in the range of 1 minute to 30 minutes. However, holding for a too long time causes the deterioration of the compound semiconductor, and hence it is undesirable.

Further, in the method for manufacturing a group III-V compound semiconductor according to the present invention, it is preferable that at least one layer of the semiconductor layers consisting of p-type dopant-nondoped layers is in contact with, and is sandwiched between two layers having a larger bandgap than that of this layer.

That is, according to the present invention, a group III-V compound semiconductor with high crystallinity can be obtained, and hence the group III-V compound semiconductor can be preferably used for a light-emitting device. Concretely, as the layered structure of the light-emitting device, so-called double hetero structure can be used in which the emitting layer is placed so as to be sandwiched between two layers each having a larger bandgap than that of the emitting layer to confine an electric charge in the emitting layer with high efficiency, resulting in high luminous efficiency. For confining an electric charge in the emitting layer with high efficiency, each bandgap of the two layers in contact with the emitting layer is larger than that of the emitting layer, preferably by 0.1 eV or more, and more preferably by 0.3 eV or more.

Further, so-called multi quantum well in which a layer having a large bandgap (hereinafter, may be referred to as barrier layer), and a layer having a small bandgap (hereinafter, may be referred to as well layer) are laminated repeatedly can be used as an emitting layer. The formation of the emitting layer in multi quantum well may sometimes result in an improvement in luminous efficiency, or a reduction in threshold of a laser diode. In such a case, multi quantum well can be preferably used.

For confining an electric charge in the well layer with high efficiency, the bandgap of the barrier layer in contact with the well layer is larger than that of the well layer, preferably by 0.1 eV or more, and more preferably by 0.3 eV or more.

For obtaining high luminous efficiency, the charge injected to the well layer is required to be confined within the well layer with high efficiency. For this, the thickness of the well layer is preferably in the range of 5 Å to 500 Å, and more preferably in the range of 5 Å to 300 Å.

When the well layer includes Al, it incorporates dopants such as oxygen with ease. Accordingly, when used as an emitting layer, there are some cases where the luminous efficiency is reduced. In such a case, the one including no Al, and represented by the general formula $In_xGa_yN$ (where x+y=1, $0 \leq x \leq 1$, $0 \leq y \leq 1$) can be used as a well layer.

In the group III-V compound semiconductor, when the InN mixed crystal ratio of the emitting layer is high, thermal stability is not sufficient, which may sometimes cause deterioration in crystal growth, or semiconductor process. For the purpose of preventing such deterioration, on a layer with a high InN mixed crystal ratio of the emitting layer, a charge injection layer with a low InN mixed crystal ratio can be laminated, to which a function as a protective layer can be imparted. For allowing the protective layer to have a sufficient protective function, the InN mixed crystal ratio and AlN mixed crystal ratio of the protective layer are preferably 10% or less, and 5% or more, respectively. More preferably, the InN mixed crystal ratio and AlN mixed crystal ratio are 5% or less, and 10% or more, respectively.

For allowing the protective layer to have a sufficient protective function, the thickness of the protective layer is preferably in the range of 10 Å to 1 μm, and more preferably in the range of 50 Å to 5000 Å. When the protective layer has a thickness of less than 10 Å, sufficient effect cannot be obtained. Also, with a thickness of more than 1 μm, the luminous efficiency is reduced, thus leading to the undesirable result.

It is noted that, as described above, when the substrate is held at a temperature in the range of 500° C. to 1300° C. in an atmosphere containing ammonia prior to the growth of the second portion, in the semiconductor to be subjected to the step, the surface layer of the semiconductor layers consisting of p-dopant nondoped layers may be a semiconductor represented by the general formula $In_xGa_yAl_zN$ (where x+y+z=1, $0 \leq x \leq 1$, $0 \leq y \leq 1$, and $0 \leq z \leq 1$).

Concretely, in this case, on the protective layer, a semiconductor represented by the general formula $In_xGa_yAl_zN$ (where x+y+z=1, $0 \leq x \leq 1$, $0 \leq y \leq 1$, and $0 \leq z \leq 1$), preferably a layer having a high InN mixed crystal ratio may be further laminated in advance, followed by thermal decomposition of the layer having a high InN mixed crystal ratio by the high temperature process. Thereafter, the second portion may be further grown.

After the first portion of the compound semiconductor is grown, when a p-type dopant-doped layer is grown in the initial stage of the growth of the second portion, the device characteristics maybe sometimes deteriorated finally. In this case, first, a p-type dopant-nondoped layer is grown, then a p-type dopant doped layer is grown, which can prevent the deterioration in device characteristics. Concretely, the protective layer is grown, then the substrate is once taken out of the reactor. Thereafter, the substrate is set in the reactor for the growth of the second portion. The protective layer may be grown, first, and then the growth of the p-type dopant-doped layer. Alternatively, prior to the growth of the protective layer, the substrate can be held once in an atmosphere containing ammonia, and then the growth of the protective layer and further the growth of the p-type dopant doped layer can be performed.

As a substrate on which the group III V compound semiconductor is grown, sapphire, SiC, Si, GaAs, ZnO, NGO($NdGaO_3$)), spinel ($MgAl_2O_4$), GaN, and the like can be used. Among these, sapphire, spinel ($MgAl_2O_4$), SiC, GaN, and Si can grow a high quality group III-V compound semiconductor crystal, and hence they are preferable. Also, SiC, GaN, and Si are preferable in that a conductive substrate can be manufactured.

In the manufacturing of the group III-V compound semiconductor by MOVPE method, the following materials can be used.

Examples of the group III material include trialkylgallium represented by the general formula $R_1R_2R_3Ga$ (where $R_1$, $R_2$, and $R_3$ each represents a lower alkyl group having 1–3 carbon atoms) such as trimethylgallium (($CH_3)_3Ga$, hereinafter, may be referred to as TMG) and triethylgallium (($C_2H_5)_3Ga$, hereinafter, may be referred to as TEG); trialkylaluminium represented by the general formula $R_1R_2R_3Al$ (where $R_1$, $R_2$, and $R_3$ each represents a lower alkyl group having 1–4 carbon atoms) such as trimethylaluminium (($CH_3)_3Al$), triethylaluminium (($C_2H_5)_3Al$, hereinafter, may be referred to as TEA), and triisobutylaluminium ((i-$C_4H_9)_3Al$); trimethylaminealane (($CH_3)_3N:AlH_3$); trialkylindium represented by the general formula $R_1R_2R_3In$ (where $R_1$, $R_2$, and $R_3$ each represents a lower alkyl group having 1–3 carbon atoms) such as trimethylindium (($CH_3)_3In$, hereinafter, may be referred to as TMI) and triethylindium (($C_2H_5)_3In$). These can be used alone, or in combination thereof.

Examples of the group V material include ammonia, hydrazine, methylhydrazine, 1,1-dimethylhydrazine, 1,2-dimethylhydrazine, t-butylamine, and ethylenediamine. These can be used alone, or in combination thereof. Of these materials, ammonia and hydrazine do not contain a carbon atom in their molecules, resulting in less contamination of the carbon into the semiconductor, and hence they are preferable.

As an n-type dopant of the group III-V compound semiconductor, Si, Ge, and O are used. Among these, Si is preferable, because a low resistive n-type can be formed with ease and a highly pure raw material is obtainable. As the raw material for doping Si, silane ($SiH_4$), disilane ($Si_2H_6$), etc, are used.

EXAMPLES

Hereinafter, the present invention will be described in detail by way of examples and comparative examples, which should not be construed as limiting the scope of the invention.

Examples 1 to 5

Using a first growth reactor, samples having only the LED lower part structure (the first portion 10) shown in FIG. 1 were grown five times successively.

Sapphire having a mirror-polished (0001) plane was washed with an organic solvent and used as a substrate 3. The growth was performed according to a two-stage growth method using a low temperature growth buffer layer. First, a GaN buffer layer 4 with a thickness of 500 Å was grown at 550° C. with using TMG and ammonia as raw materials, and hydrogen as a carrier gas.

Next, after the temperature was increased to 1100° C., an n-type GaN layer 5 with a thickness of 3 μm was grown with using TMG and ammonia, and silane ($SiH_4$) as a dopant. Subsequently, the supply of silane was stopped, and a nondoped GaN layer 6 with a thickness of 1500 Å was grown.

Then, the temperature was decreased to 760° C., and a nondoped GaN layer 7 with a thickness of 300 Å was grown with using a carrier gas of nitrogen, TEG and ammonia. Thereafter, with using TEG, TMI, and ammonia $In_{0.3}Ga_{0.7}N$ layer (InGaN layer 8) with a thick of 50 Å which is a quantum well light emitting layer was grown. Subsequently, with using TEG, TEA and ammonia an $Al_{0.2}Ga_{0.8}N$ layer (AlGaN layer 9) with a thickness of 150 Å was grown.

After the temperature was decreased to room temperature, the samples were taken out of the first growth reactor. Then, the samples were subjected to He—Cd laser radiation to measure the room temperature photoluminescence (hereinafter, may be abbreviated as PL), thus evaluating optical characteristics. All samples exhibited clear bluish green fluorescence.

Then, the samples for which the PL measurement have been completed were subjected to surface cleaning using acetone, hydrofluoric acid, and a $NaOH/H_2O_2$ solution in this order.

Thereafter, the samples were put in a second growth reactor to grow the remaining structure (the second portion 13) of the LED. First, in a stream of a mixed gas of ammonia and nitrogen, the samples were held at 900° C. or 1100° C. for 1, 3 or 5 minutes. The conditions of the high temperature holding step in ammonia of each sample are shown in Table 1. Thereafter, at 760° C., TEG and TEA were supplied to grow an AlGaN layer 11 with a thickness of 150 Å. Then, the temperature was increased to 1100° C. again, and with using TMG and ammonia, and $ECp_2Mg$ as a p-type dopant source, a p-type GaN layer 12 with a thickness of 5000 Å was grown.

After completing the growth, the substrate was taken out and subjected to heat treatment at 800° C. in nitrogen, thus the p-type GaN layer 12 was made to be a low resistive p-type layer.

The samples thus obtained were processed by the method described below to form a p-electrode and an n-electrode, resulting in an LED.

First, a photoresist pattern was formed by a photolithography method to form a film of NiAu to be used as a p-electrode in 1500 Å thickness by a vacuum evaporation method, and formed a p-electrode pattern by a lift-off method. Then, a photoresist pattern was formed by a photolithography method to form a film of Al to be used as an n-electrode in 1000 Å thickness by a vacuum evaporation method, and formed an n-electrode pattern by a lift-off method.

When a forward current of 20 mA was passed through each LED sample in which the p- and n-electrodes have been formed, every sample exhibited clear blue light emission, and the luminance shown in Table 1 was obtained.

TABLE 1

| | Conditions on the Holding Step | | Luminance |
| --- | --- | --- | --- |
| | Temperature (° C.) | Time (Minute) | (mcd) |
| Example 1 | 1100 | 5 | 560 |
| Example 2 | 1100 | 3 | 750 |
| Example 3 | 1100 | 1 | 540 |
| Example 4 | 900 | 5 | 400 |
| Example 5 | 900 | 3 | 680 |

Example 6

Figure 4:
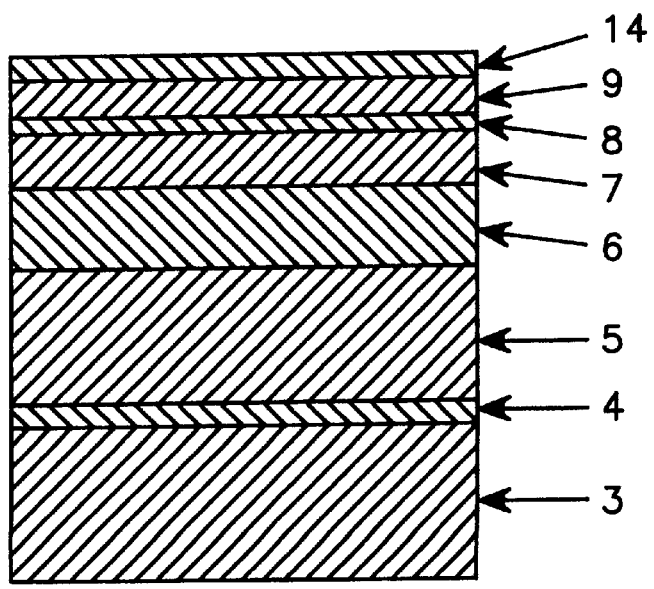
FIG. 4 is a cross-sectional view illustrating the construction of semiconductor layers manufactured in example 6.

A sample having a structure shown in FIG. 4 was grown in the same manner as in examples 1 to 5. That is, on sapphire, a buffer layer 4, n-type GaN layer 5, and nondoped GaN layer 6 were grown, and further, at 785° C., a nondoped GaN layer 7 with a thickness of 300 Å, a nondoped InGaN layer 8 with a thickness of 30 Å, and an AlGaN layer 9 with a thickness of 300 Å were grown. Thereafter, a nondoped InGaN layer 14 was further grown in 30 Å thickness, and the temperature was decreased to take the sample out of the growth reactor. The InGaN layer 14 had an InN mixed crystal ratio of approximately 30%. The sample was subjected to heat treatment in the second growth reactor in the same manner as in example 2 to further grow an AlGaN layer 11 with a thickness of 150 Å at 785° C., and grow a p-type GaN layer 12 with a thickness of 5000 Å at 1100° C. This was processed into an LED in the same manner as in examples 1 to 5. The evaluation thereof indicated that blue light emission was observed, and the luminance was found to be 1.4 cd.

Example 7

An LED was manufactured on the same conditions as those in examples 1 to 5, except that the high temperature holding step in ammonia was not performed, (i.e., the first portion 10 was grown in the first growth reactor, and the remaining structure (the second portion 13) was grown in the second growth reactor). The evaluation thereof indicated that clear blue light emission was observed, and the luminance was found to be 150 mcd.

Comparative Example 1

Using a larger type of growth reactor than that used in examples 1 to 7, a sample having the lower part structure (the first portion 10) of FIG. 1 was grown one time to measure the room temperature PL, and intensive bluish green fluorescence was confirmed. Then, using the same growth reactor, the growth of the upper part structure (the second portion 13) of FIG. 1 including a step using a p-type dopant source of ECp$_2$Mg was conducted one time. For checking the effect of the residue of the p-type dopant source in the reactor, the sample of the lower part structure (the first portion 10) of FIG. 1 was grown 7 times successively using the same reactor. Then, the room temperature PL intensity was measured for the samples thus obtained.

As shown in Table 2, as compared with the sample prior to the use of a Mg source, every sample after using the Mg source exhibited very low room temperature PL intensity, resulting in deterioration in optical characteristics. The quality was insufficient for growing the second structure thereon to form LEDs.

TABLE 2

| | PL Intensity (Relative Value) |
| --- | --- |
| Prior to use of Mg source | 100 |
| After using Mg source First time | 0 |
| After using Mg source Second time | 1.9 |
| After using Mg source Third time | 0.3 |
| After using Mg source Fourth time | 3.9 |
| After using Mg source Fifth time | 1.4 |
| After using Mg source Sixth time | 6.7 |
| After using Mg source Seventh time | 5.7 |

Example 8

The large growth reactor used in comparative example 1 was disassembled, washed, and dried. Thereafter, the growth reactor was assembled and the quartz member was subjected to heat treatment at 1100° C. in hydrogen.

For confirming that the effect of Mg source has stopped, the lower part structure (the first portion 10) of the LED of FIG. 1 was grown, and then taken out of the reactor. The measurement of the room temperature PL indicated that clear bluish green fluorescence was exhibited.

The sample for which the room temperature PL measurement has been carried out was set in the second growth reactor used in examples 1 to 7. Then, without conducting the high temperature holding step in ammonia, the growth of the remaining layered structure (the second portion 13) including a step using a Mg source was performed. On the sample thus obtained, p- and n-electrodes were formed in the same manner as that used in examples 1 to 7 to pass a forward current of 20 mA therethrough. The evaluation thereof indicated that blue light emission was observed, and the luminance was found to be 115 mcd.

Example 9

Using the apparatus in example 8, a buffer layer 4 with a thickness of 500 Å, an n-type GaN layer 5 with a thickness of 4 μm, a nondoped GaN layers 6 and 7 with an overall thickness of 7000 Å, an InGaN layer 8 with a thickness of 30 Å, and an AlGaN layer 9 with a thickness of 300 Å were grown, and the temperature was decreased to take the obtained sample out of the growth reactor. The sample was subjected to a heat treatment in the second growth reactor in the same manner as in example 2. Subsequently, an AlGaN layer 11 with a thickness of 150 Å, and a p-type GaN layer 12 with a thickness of 5000 Å were grown, and this was processed into an LED in the same manner as in examples 1 to 5. The evaluation thereof indicated that blue light emission was observed, and the luminance was found to be 500 mcd.

Example 10

Figure 5:
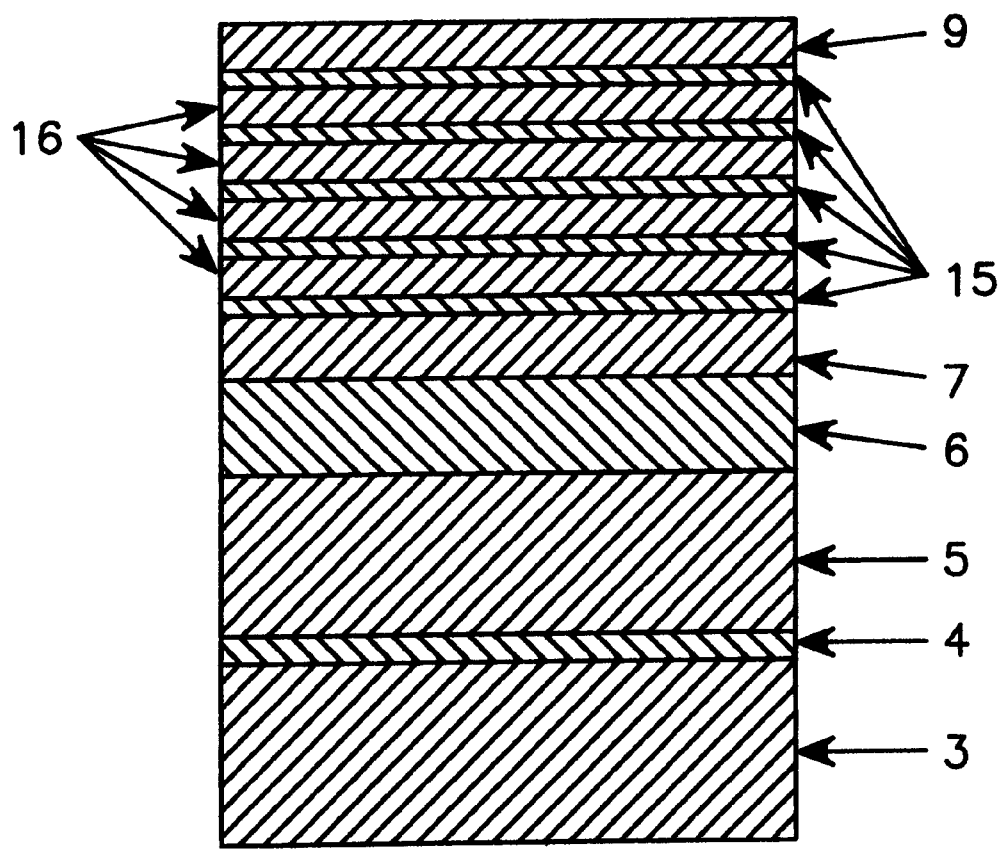
FIG. 5 is a cross-sectional view illustrating the construction of semiconductor layers manufactured in example 10.

In the first growth reactor, a sample with the structure shown in FIG. 5 was grown. That is, in the same manner as in examples 1 to 5, a buffer layer 4 with a thickness of 500 Å, an n-type GaN layer 5 with a thickness of 3 μm, a nondoped GaN layer 6 with a thickness of 1600 Å were grown, followed by the growth of a nondoped GaN layer 7 with a thickness of 250 Å at 785° C. Thereafter, a 30-Å thick nondoped InGaN well layer 15 and a 150-Å thick nondoped GaN barrier layer 16 are alternatively grown, 5 times and 4 times, respectively. Further, a 300-Å thick AlGaN layer 9 was grown, and the temperature was decreased to take the sample out of the growth reactor. In the same manner as in example 9, the sample was subjected to a heat treatment to grow an AlGaN layer 11 and a p-type GaN layer 12 in the second growth reactor. This was processed into an LED in the same manner as in examples 1 to 5. The evaluation thereof indicates that bluish green light emission was observed, and the luminance was found to be 3 cd.

What is claimed is:

1. A method which comprises manufacturing a group III-V compound semiconductor represented by the general formula $In_xGa_yAl_zN$ (where x+y+z=1, $0 \leq x \leq 1$, $0 \leq y \leq 1$, and $0 \leq z \leq 1$) by a metalorganic vapor phase epitaxy method, said group III-V compound semiconductor having a semiconductor layer consisting of a p-type dopant-nondoped layer, and a semiconductor layer including a p-type dopant-doped layer, wherein different reactors are used for growing the semiconductor layer consisting of a p-type dopant-nondoped layer and for doping a p-type dopant.

2. A method for manufacturing a group III-V compound semiconductor represented by the general formula $In_xGa_yAl_zN$ (where x+y+z=1, $0 \leq x \leq 1$, $0 \leq y \leq 1$, $0 \leq z \leq 1$) by a metalorganic vapor phase epitaxy method, the group III-V compound semiconductor having a semiconductor layer consisting of a p-type dopant-nondoped layer, and a semiconductor layer including a p-type dopant-doped layer, wherein the method comprises the steps of: (1) growing a semiconductor including one or more layers consisting of a p-type dopant-nondoped layer in one reactor, and taking it out of the reactor; and (2) disposing the semiconductor obtained in the reactor again to grow a semiconductor layer including a p-type dopant-doped layer on the semiconductor layer consisting of a p-type dopant-nondoped layer, in this order, and at least one of the steps (1) or (2) is repeated a number of times.

3. A method for manufacturing a group III-V compound semiconductor according to claim 2, wherein the method further comprises a step (3) of cleaning the inside of the reactor subsequent to the step (2), and the steps (1) to (3) are repeated.

4. A method for manufacturing a group III-V compound semiconductor according to claim 1, wherein the method further comprises a step of holding a temperature in the range of 500° C. to 1300° C. prior to doping a p-type dopant.

5. A method for manufacturing a group III-V compound semiconductor according to claim 4, wherein the surface layer of the semiconductor layers consisting of a p-type dopant-nondoped layer is a semiconductor represented by the general formula $In_xGa_yAl_zN$ (where x+y+z=1, $0 \leq x \leq 1$, $0 \leq y \leq 1$, and $0 \leq z \leq 1$).

6. A method for manufacturing a group III-V compound semiconductor according to claim 1, wherein in the semiconductor layers including a p-type dopant-doped layer, the layer to be grown first is a p-type dopant-nondoped layer.

7. A method for manufacturing a group III-V compound semiconductor according to claim 1, wherein at least one layer of the semiconductor layers consisting of a p-type dopant-nondoped layer is in contact with, and is sandwiched between two layers having a larger bandgap than that of this layer.

8. A method for manufacturing a group III-V compound semiconductor according to claim 2, wherein the method further comprises a step of holding a temperature in the range of 500° C. to 1300° C. prior to doping a p-type dopant.

9. A method for manufacturing a group III-V compound semiconductor according to claim 2, wherein in the semiconductor layers including a p-type dopant-doped layer, the layer to be grown first is a p-type dopant-nondoped layer.

10. A method for manufacturing a group III-V compound semiconductor according to claim 2, wherein at least one layer of the semiconductor layers consisting of a p-type dopant-nondoped layer is in contact with, and is sandwiched beteen two layers having a larger bandgap than that of this layer.

* * * * *